United States Patent
Ito et al.

(10) Patent No.: US 10,633,736 B2
(45) Date of Patent: Apr. 28, 2020

(54) FILM FORMATION APPARATUS

(71) Applicant: Shibaura Mechatronics Corporation, Yokohama-shi, Kanagawa (JP)

(72) Inventors: Akihiko Ito, Yokohama (JP); Yoshinao Kamo, Yokohama (JP); Shigeki Matsunaka, Yokohama (JP); Atsushi Fujita, Yokohama (JP)

(73) Assignee: SHIBAURA MECHATRONICS CORPORATION, Yokohama-Shi, Kanagawa (JP)

( * ) Notice: Subject to any disclaimer, the term of this patent is extended or adjusted under 35 U.S.C. 154(b) by 25 days.

(21) Appl. No.: 15/838,982

(22) Filed: Dec. 12, 2017

(65) Prior Publication Data

US 2018/0163295 A1    Jun. 14, 2018

(30) Foreign Application Priority Data

Dec. 13, 2016    (JP) .................................. 2016-240856
Nov. 27, 2017    (JP) .................................. 2017-227203

(51) Int. Cl.
*C23C 14/50*    (2006.01)
*C23C 16/458*    (2006.01)
(Continued)

(52) U.S. Cl.
CPC ........ *C23C 14/3464* (2013.01); *C23C 14/022* (2013.01); *C23C 14/185* (2013.01); *C23C 14/34* (2013.01); *C23C 14/505* (2013.01); *C23C 14/541* (2013.01); *C23C 16/458* (2013.01); *H01J 37/32* (2013.01);
(Continued)

(58) Field of Classification Search
None
See application file for complete search history.

(56) References Cited

U.S. PATENT DOCUMENTS

2003/0215578 A1* 11/2003 Okumura .......... H01L 21/68735
                                                                427/569
2004/0047108 A1*  3/2004 Extrand ............. H05K 13/0084
                                                                361/220
2018/0274085 A1*  9/2018 Nakamuta ............... C23C 14/50

FOREIGN PATENT DOCUMENTS

CN      105463386 A      4/2016
TW      201017809 A1     5/2010
(Continued)

*Primary Examiner* — Binu Thomas
(74) *Attorney, Agent, or Firm* — Nath, Goldberg & Meyer; Jerald L. Meyer; Stanley N. Protigal

(57) ABSTRACT

A film formation apparatus includes a carrying unit circulating and carrying an electronic component in a sputtering chamber, a film formation processing unit including a mount surface and a mount member which is mounted on the mount surface, and on which the electronic component is placed. The mount member includes a holding sheet having an adhesive surface, and a non-adhesive surface, and a sticking sheet having a first sticking surface with adhesiveness sticking to the non-adhesive surface, and a second sticking surface with adhesiveness sticking to the mount surface of the tray. The adhesive surface includes a pasting region for pasting the electronic components. The first sticking surface sticks across an entire region of the non-adhesive surface corresponding to at least the pasting region to provide a file formation apparatus which employs a simple structure that is capable of suppressing heating of electronic components.

8 Claims, 9 Drawing Sheets

(51) Int. Cl.
  *H01J 37/32* (2006.01)
  *H01L 21/687* (2006.01)
  *C23C 14/34* (2006.01)
  *H01L 21/56* (2006.01)
  *H01J 37/34* (2006.01)
  *H01L 23/00* (2006.01)
  *H01L 23/552* (2006.01)
  *C23C 14/18* (2006.01)
  *C23C 14/54* (2006.01)
  *C23C 14/02* (2006.01)
  *H01L 21/683* (2006.01)
  *H01L 21/67* (2006.01)
  *H01L 23/31* (2006.01)

(52) U.S. Cl.
  CPC ........ *H01J 37/32715* (2013.01); *H01J 37/34* (2013.01); *H01J 37/3429* (2013.01); *H01L 21/561* (2013.01); *H01L 21/563* (2013.01); *H01L 21/67132* (2013.01); *H01L 21/6835* (2013.01); *H01L 21/68764* (2013.01); *H01L 21/68771* (2013.01); *H01L 21/68778* (2013.01); *H01L 23/552* (2013.01); *H01L 24/97* (2013.01); *H01L 23/3121* (2013.01); *H01L 2221/68313* (2013.01)

(56) References Cited

FOREIGN PATENT DOCUMENTS

| TW | 201241222 A | 10/2012 | |
|----|-------------|---------|---|
| WO | 2013/035819 A1 | 3/2013 | |
| WO | WO-2017038466 A1 * | 3/2017 | ............. C23C 14/50 |

* cited by examiner

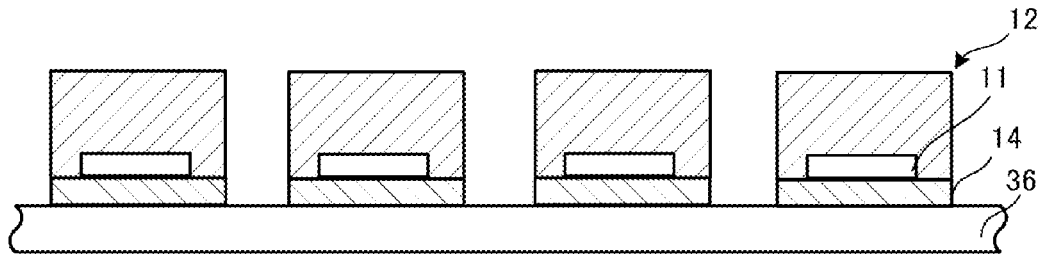
*FIG. 9A*
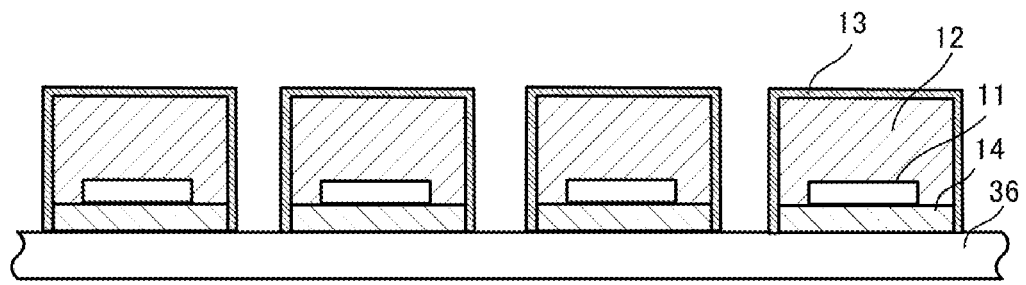
*FIG. 9B*
| FILM FORMATION MATERIAL | POSITION | TARGET MATERIAL | TARGET THICKNESS [nm] | FILM FORMATION RATE [nm/s] | TABLE ROTATION SPEED [rpm] | APPLIED POWER | | Ar GAS FLOW VOLUME [sccm] | RF (CYLINDRICAL ELECTRODE) | FILM FORMATION TIME [s] |
|---|---|---|---|---|---|---|---|---|---|---|
| | | | | | | 41A [W] | 41B [W] | | APPLIED POWER [W] | |
| | M3 | Ar BOMBARD | | | 30 | | | 150.0 | 300 | 600.0 |
| SUS | M1 | SUS | 200.00 | 0.73 | 6 | 2300 | 3000 | 120.0 | | 280 |
| Cu | M2 | Cu | 5000.00 | 1.40 | 6 | 2300 | 3000 | 100.0 | | 3570 |
| SUS | M1 | SUS | 500.00 | 0.73 | 6 | 2300 | 3000 | 120.0 | | 690 |
*FIG. 10*

FILM FORMATION APPARATUS

CROSS-REFERENCE TO RELATED APPLICATION

This application is based upon and claims the benefit of priorities from Japan Patent Application No. 2016-240856, filed on Dec. 13, 2016, and Japan Patent No. 2017-227203, filed on Nov. 27, 2017, the entire contents of which are incorporated herein by reference.

FIELD OF THE INVENTION

The present disclosure relates to a film formation apparatus.

BACKGROUND

A large number of semiconductor devices that are electronic components are built in a wireless communication apparatus represented by a mobile phone. Semiconductor devices are required to suppress an adverse effect of electromagnetic waves to an interior and an exterior like a leakage of electromagnetic waves in order to prevent an adverse effect to communication characteristics. Hence, semiconductor devices which have a shielding function against the electromagnetic waves have been applied.

In general, a semiconductor device is formed by mounting a semiconductor chip on an interposer substrate that is an intermediate substrate to a mounting substrate, and by sealing this semiconductor chip by a resin. By providing a conductive electromagnetic-wave shielding film on the top face and the side face of this sealing resin, the semiconductor devices achieving the shielding function have been provided (see WO 2013/035819 A).

Such an electromagnetic-wave shielding film can be a laminate film of multiple kinds of metals. For example, an electromagnetic-wave shielding film is known which employs a laminated structure of forming a Cu film on an SUS film, and further forming an SUS film thereon.

In order to accomplish a sufficient shielding effect for an electromagnetic-wave shielding film, it is necessary to decrease the electric resistivity. Hence, the electromagnetic-wave shielding film needs to have a thickness to some level. In semiconductor devices, in general, when a film has a thickness of substantially 1 µm to 10 µm, an excellent shielding characteristic is expectable. In the case of the above electromagnetic-wave shielding film employing the laminated structure of SUS, Cu, and SUS, it is known that, when the thickness is substantially 1 to 5 µm, an excellent shielding effect is expectable.

As a forming method for the electromagnetic-wave shielding film, plating method is known. However, since the plating method needs wet processes such as a pre-process step, a plating process step, and a post-process step like wet-cleaning, those result in the increase of the manufacturing cost for a semiconductor device.

Accordingly, sputtering method that is a dry process is getting attention. A plasma processing apparatus that forms a film by plasma has been proposed as a film formation apparatus by sputtering method. The plasma processing apparatus introduces an inactive gas into a vacuum chamber in which a target is placed, and applies a DC voltage. The ions of the plasma inactive gas are caused to be collided with the target of the film formation material, and a film is formed by depositing the material beaten out from the target on a work-piece.

General plasma processing apparatuses are applied for a film formation with a thickness of 10 to several 100 nm that can be formed by a process time of several ten seconds to several minutes. However, as described above, it is necessary to form a film with a thickness in a micron order as the electromagnetic-wave shielding film. Since sputtering is a technology of forming a film by depositing particles of the film formation material on an object on which the film is formed, the thicker film thickness lengthens the time required to form a film.

Hence, in order to form the electromagnetic-wave shielding film, a processing time of substantially several ten minutes to an hour is necessary which is longer than general sputtering. In the case of, for example, the electromagnetic-wave shielding film employing the laminated structure of SUS, Cu, and SUS, a process time of around an hour is necessary in some cases to obtain a thickness of 5 µm.

In this case, according to sputtering method by plasma, a package that is an exterior component of a semiconductor device is continuously exposed to the plasma heat during the process time. Consequently, the package may be heated to a temperature around 200° C. until a film with a thickness of 5 µm is obtained.

In contrast, the heat resistant temperature of the package is substantially 200° C. in the case of a temporal heating of substantially several seconds to several ten seconds, but when the heating time exceeds several minutes, the heat resistant temperature is generally around 150° C. Hence, it is difficult to form the electromagnetic-wave shielding film in a micron order by general plasma sputtering method.

In order to address this technical disadvantage, plasma processing apparatuses may be provided with a cooling apparatus that suppresses a temperature rise of semiconductor packages. In this case, the apparatus structure becomes complex and large in size.

An objective of the present disclosure is to provide a film formation apparatus which employs a simple structure that is capable of suppressing heating of electronic components.

SUMMARY OF THE INVENTION

In order to accomplish the above objective, a film formation apparatus according to the present disclosure includes:

a chamber that is a container in which a sputter gas is introduced;

a film formation processing unit that includes a sputter source which is provided in the chamber, and which deposits a film formation material by the sputter source, and forms a film on an electronic component using the sputter source;

a tray which is installed at a processing region of the film formation processing unit, and which includes amount surface; and amount member which is mounted on the mount surface, and on which the electronic component is placed, in which the mount member includes:

a holding sheet which has an adhesive surface that is one surface with adhesiveness, and a non-adhesive surface that is the other surface without an adhesiveness; and a sticking sheet which has a first sticking surface with adhesiveness that is one surface sticking to the non-adhesive surface, and a second sticking surface with adhesiveness that is the other surface sticking to the mount surface of the tray, the adhesive surface includes a pasting region for pasting the electronic components, and the first sticking surface sticks across an entire region of the non-adhesive surface corresponding to at least the pasting region.

In addition, a film formation apparatus according to the present disclosure includes:

a chamber that is a container in which a sputter gas is introduced;

a carrying unit which is provided in the chamber, and which circulates and carries an electronic component;

a film formation processing unit which includes a sputter source that deposits a film formation material by sputtering on the electronic component being circulated and carried by the carrying unit to form a film, and which forms the film on the electronic component using the sputter source;

a tray which is carried by the carrying unit, and which includes a mount surface; and amount member which is mounted on the mount surface, and on which the electronic component is placed, in which the mount member includes:

a holding sheet which has an adhesive surface that is one surface with adhesiveness, and a non-adhesive surface that is the other surface without an adhesiveness; and a sticking sheet which has a first sticking surface with adhesiveness that is one surface sticking to the non-adhesive surface, and a second sticking surface with adhesiveness that is the other surface sticking to the mount surface of the tray, the adhesive surface includes a pasting region for pasting the electronic components, and the first sticking surface sticks across an entire region of the non-adhesive surface corresponding to at least the pasting region.

A frame that defines a part of or all of an outer circumference of the pasting region may be pasted on the adhesive surface of the holding sheet; and the first sticking surface may stick to, in addition to the entire region of the non-adhesive surface corresponding to the pasting region, a region of the non-adhesive surface corresponding to the frame.

When an adhesive force between the first sticking surface and the non-adhesive surface is Fa, and an adhesive force between the second sticking surface and the mount surface is Fb, Fa<Fb may be satisfied.

The sticking sheet may be formed of a material such that a separation resistance of the first sticking surface relative to the non-adhesive surface is smaller than a separation resistance of the second sticking surface relative to the mount surface.

The sticking sheet may have a thermal conductivity of equal to or greater than 0.1 W/(m·K).

According to the present disclosure, a film formation apparatus which employs a simple structure that is capable of suppressing heating of electronic components can be provided.

BRIEF DESCRIPTION OF THE DRAWINGS

FIGS. 9A and 9B are each an explanatory diagram illustrating a film formation on the electronic component;

FIG. 10 is an explanatory diagram illustrating a film formation condition of a comparative example and that of an example;

DETAILED DESCRIPTION OF THE EMBODIMENTS

An embodiment according to the present disclosure (referred to as this embodiment below) will be described in detail with reference to the accompanying drawings.

[Electronic Component]

Figure 1:
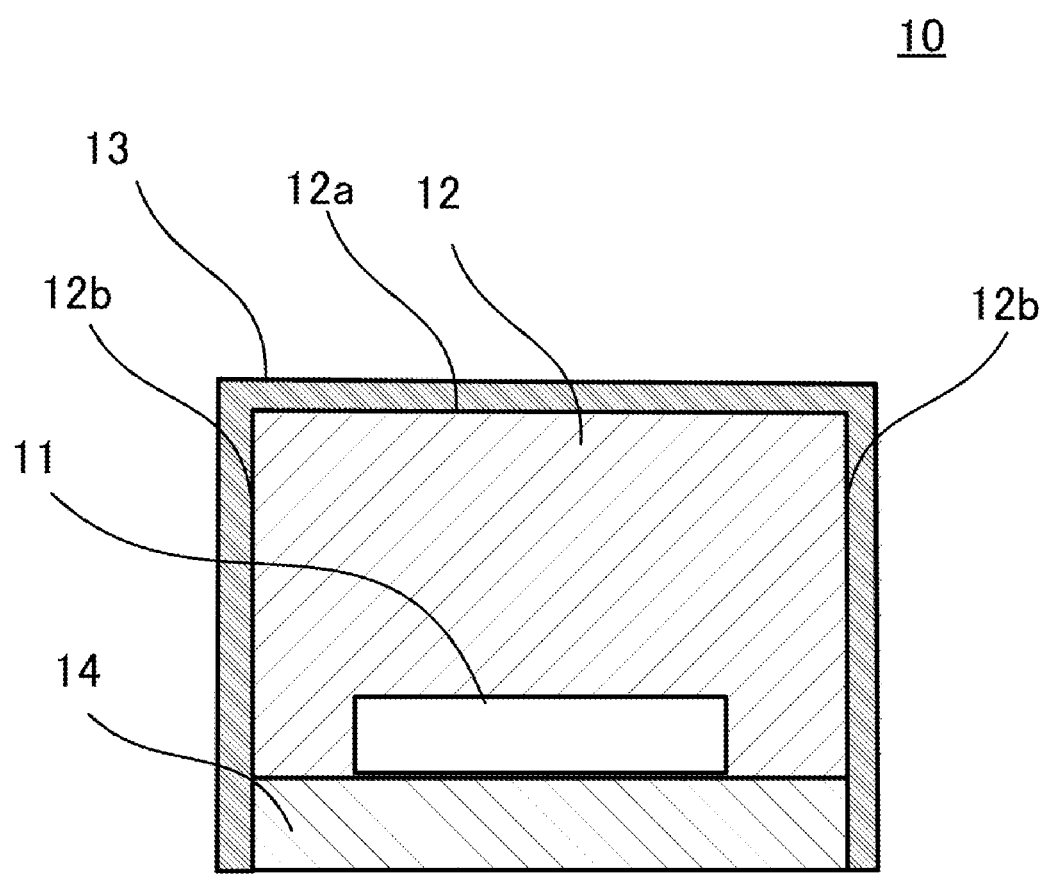
FIG. 1 is an exemplary cross-sectional view illustrating an electronic component according to an embodiment.

As illustrated in FIG. 1, an electronic component that is a film-formation object according to this embodiment includes a package 12 which seals an element 11. The element 11 is a surface mounting component, such as a semiconductor chip, a diode, a transistor, a capacitor, and an SAW filter. In the following explanation, a semiconductor chip is applied as an example of the element 11. The semiconductor chip in this case is configured as an integrated circuit which integrates multiple electronic elements.

The element 11 is mounted on the surface of a substrate 14. In the substrate 14, a circuit pattern is formed on the surface of a plate formed of ceramics, glass, an epoxy resin, etc. The element 11 and the circuit pattern are connected by soldering.

The package 12 is configured by sealing the surface of the substrate 14 on which the elements 11 are mounted by a synthetic resin so as to cover the elements 11. The package 12 is formed in a substantially cuboid shape.

According to this embodiment, an electromagnetic-wave shielding film 13 is formed on an top surface 12a and side surfaces 12b of the above electronic component 10. The electromagnetic-wave shielding film 13 is a film which shields electromagnetic waves and which is formed of conductive materials. In order to achieve a shielding effect, the electromagnetic-wave shielding film 13 may be formed on at least the top surface 12a of the package 12. The electromagnetic-wave shielding film 13 on the side surfaces 12b is for grounding. Note that the top surface 12a of the package 12 is an outermost surface opposite to a surface to be mounted on a product.

When the electronic component 10 is placed horizontally, the top surface 12a becomes an upper surface located at the highest position, but may be directed upwardly or not directed upwardly when the electronic component 10 mounted. The side surfaces 12b are outer circumferences formed at a different angle relative to the top surface 12a. A corner may be formed between the top surface 12a and the side surface 12b, or a curved surface may be formed.

[Film Formation Apparatus]

Figure 2:
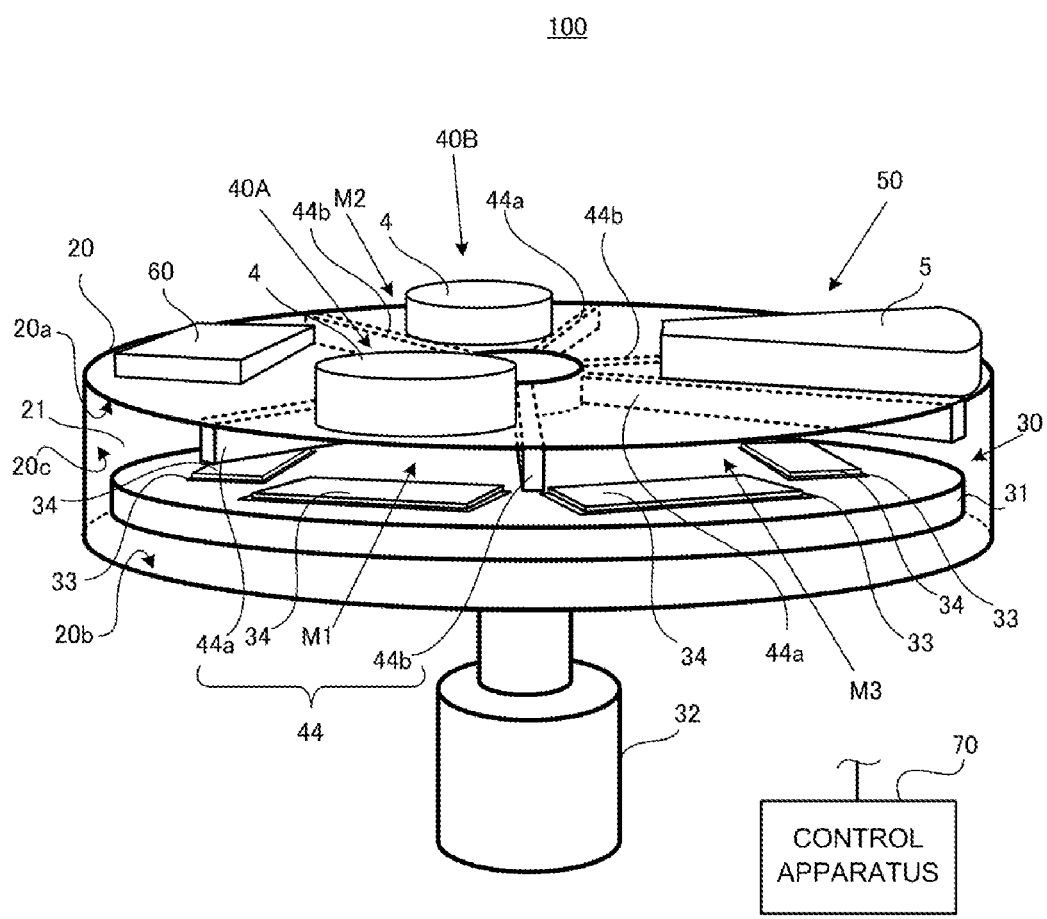
FIG. 2 is a transparent perspective view of a film formation apparatus according to the embodiment.

A film formation apparatus 100 according to this embodiment will be described with reference to FIGS. 2 to 7. The film formation apparatus 100 forms the electromagnetic-wave shielding film 13 on the outer surface of the package 12 for each electronic component 10 by sputtering. As illustrated in FIG. 2, when a rotary table 31 rotates, the electronic component 10 on the tray 34 held by a holding unit 33 moves along a circular trajectory, and when passing through a position facing a sputter source 4, the film formation apparatus 100 causes sputtered particles from a target 41 (see FIG. 3) to stick on the electronic component 10, thereby forming a film.

Figure 3:
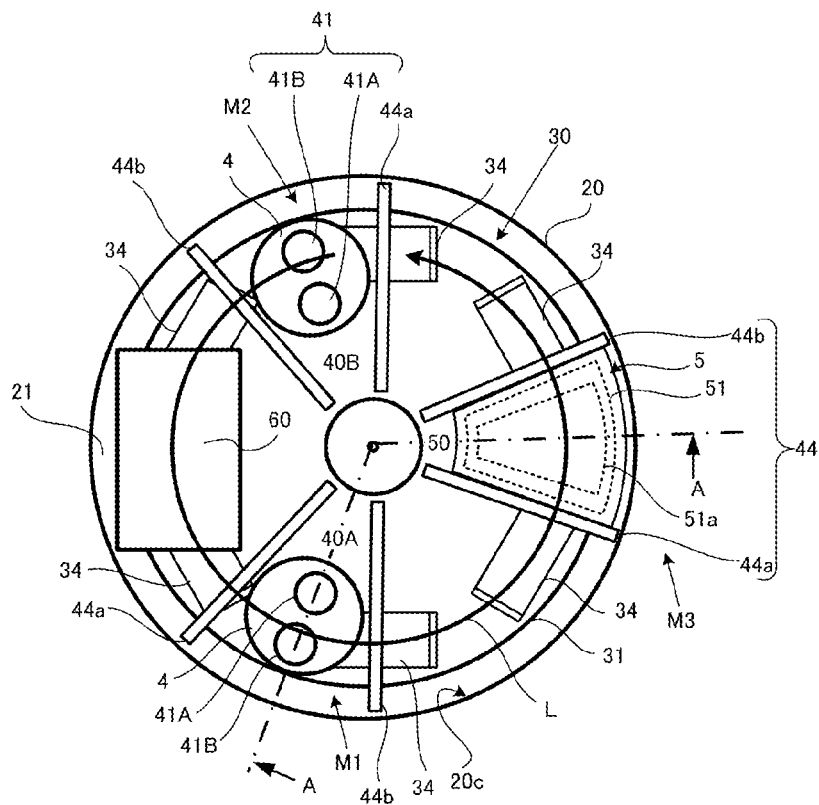
FIG. 3 is a transparent plan view of the film formation apparatus according to the embodiment.

As illustrated in FIGS. 2 and 3, the film formation apparatus 100 includes a chamber 20, a carrying unit 30, film formation processing units 40A and 40B, a surface processing unit 50, a load locking unit 60, and a control apparatus 70.

[Chamber]

The chamber 20 is a container in which a reactive gas G is introduced. The reactive gas G involves a sputter gas G1 for sputtering, and process gases G2 for various processes (see FIG. 4). In the following description, when the sputter gas G1 and the process gases G2 are not distinguished, those will be collectively referred to as the reactive gas G in some cases. The sputter gas G1 is the gas for performing sputtering on the package 12 of the electronic component 10, causing produced ions, etc., to collide with the target 41 by plasma generated by an application of electric power. For example, an inactive gas like argon gas is applicable as the sputter gas G1.

The process gas G2 is for surface process, such as etching and asking. Hereinafter, such a surface process may be referred to as reverse sputtering. The process gas G2 can be changed as appropriate in accordance with the purpose of processing. When, for example, etching is performed, inactive gas like argon gas can be applied as etching gas. According to this embodiment, the cleansing of the surface of the electronic component 10 and surface roughening are carried out by using argon gas. For example, by performing cleansing on the surface and surface roughening in a nano order, the sticking force of the film can be enhanced.

The internal space of the chamber 20 forms a vacuum space 21. This vacuum space 21 has airtightness and can be vacuumed by depressurization. For example, as illustrated in FIG. 2 and FIG. 4, the vacuum space 21 is an airtight space with a circular cylindrical shape defined by an internal top surface 20a of the chamber 20, an internal bottom surface 20b, and an internal circumference 20c.

Figure 4:
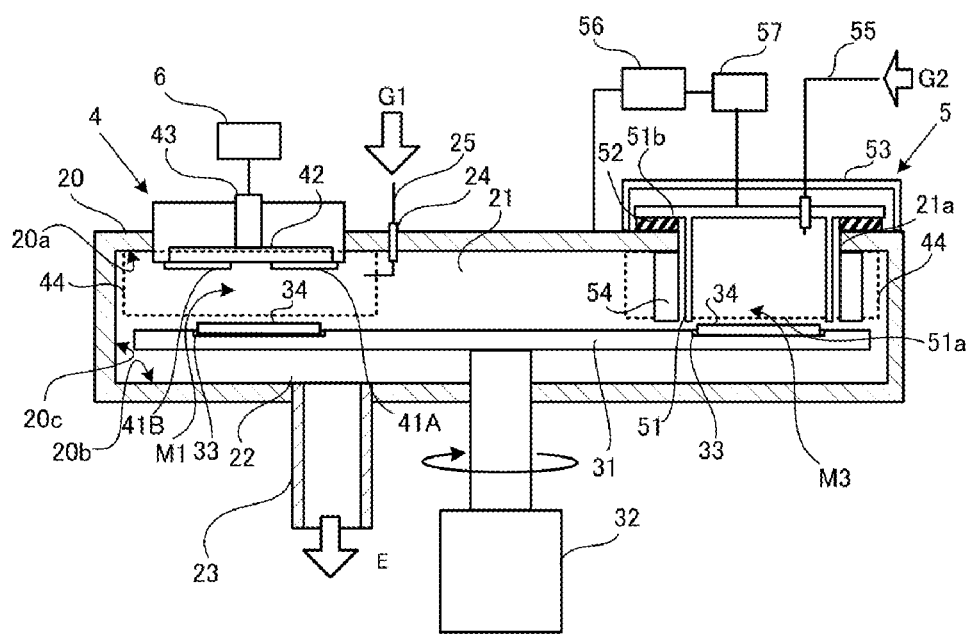
FIG. 4 is an exemplary vertical cross-sectional view taken along a line A-A in FIG. 3.

As illustrated in FIG. 4, the chamber 20 includes an exhaust port 22 and an inlet port 24. The exhaust port 22 is an outlet for ensuring a flow of gas between the exterior and the vacuum chamber 21, and for performing exhaust E. This exhaust port 22 is formed in, for example, the bottom of the chamber 20. The exhaust port 22 is connected with an exhausting unit 23. The exhausting unit 23 includes a pipe, unillustrated pump, valve, etc. The interior of the vacuum space 21 is depressurized by the exhausting process of this exhausting unit 23.

The inlet port 24 is an outlet for introducing the sputtering gas G1 around the target 41 in the vacuum space 21. This inlet port 24 is connected with a gas supply unit 25. The gas supply unit 25 is provided one by one for each target 41. In addition, the gas supply unit 25 includes, in addition to pipework, unillustrated gas supplying source of the reactive gas G, a pump, a valve, etc. The sputtering gas G1 is introduced in the vacuum space 21 via the inlet port 24 by this gas supply unit 25. An opening 21a in which the surface processing unit 50 is inserted is formed in the upper part of the chamber 20 as will be described later.

[Carrying Unit]

The carrying unit 30 is a device provided in the chamber 20, and circulates and carries the electronic component 10 along the circumference trajectory. The terms circulation and carrying indicate that the tray 34 on which the electronic component 10 is placed is moved along the circular trajec-tory. The trajectory on which the tray 34 is moved by the carrying unit 30 will be referred to as a carrying path L. The carrying unit 30 includes the rotary table 31, a motor 32, and the holding unit 33. In addition, the holding unit 33 holds the tray 34 on which the mount member 35 is placed.

The rotary table 31 is a circular plate. The motor 32 is a drive source which applies drive force to the rotary table 31 and rotates the rotary table 31 around the center of the circle as an axis. The holding unit 33 is a component that holds the tray 34 carried by the carrying unit 30 to be described later. The multiple holding units 33 are provided on the top surface of the rotary table 31 at an equal pitch around a circle. For example, the region where each holding unit 33 holds the tray 34 is formed in the direction parallel to the tangent of the circle in the circumference direction of the rotary table 31, and is provided at equal pitch in the circumference direction. More specifically, the holding unit 33 is a groove, a hole, a protrusion, a jig, a holder, etc., that holds the tray 34. A mechanical chuck or an adhesive chuck may be adopted.

Figure 5:
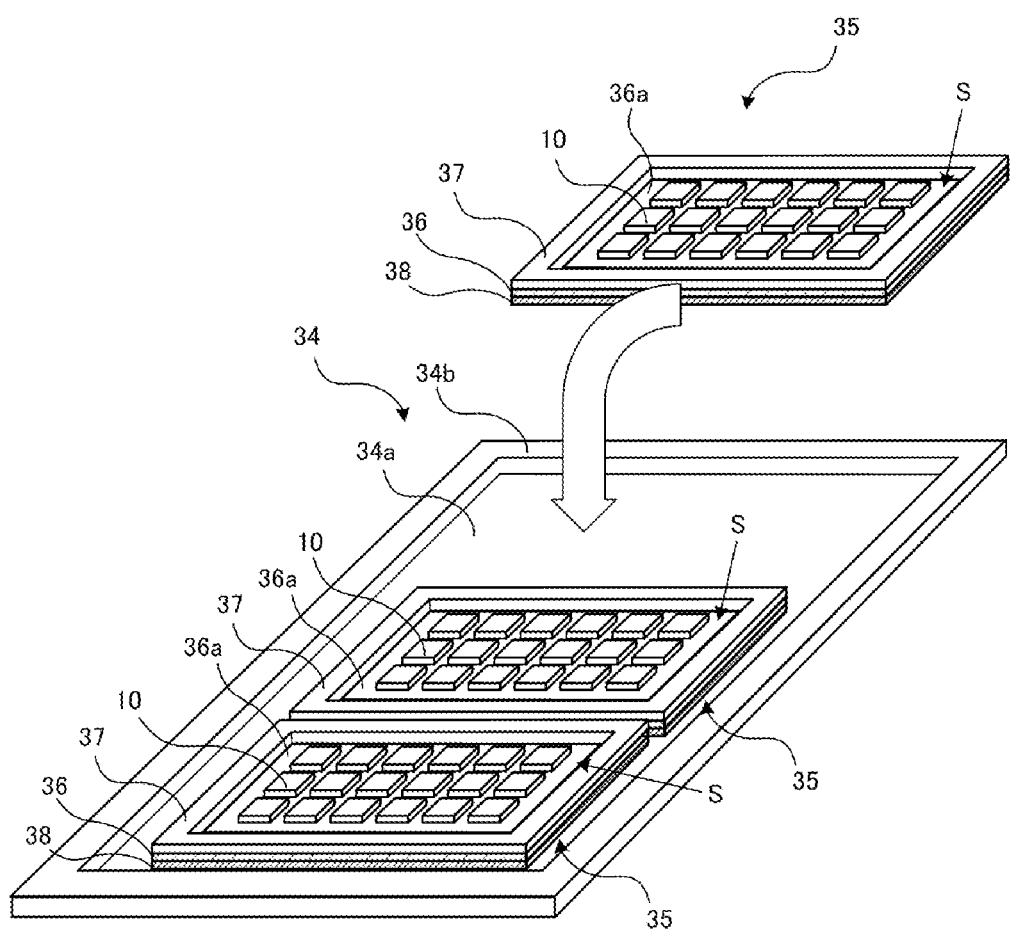
FIG. 5 is a perspective view illustrating a tray on which electronic components are placed.

As illustrated in FIG. 5, the tray 34 is a member that has a flat mount surface 34a. The mount surface 34a is one plane of a rectangular flat plate. Peripheral walls 34b are formed around the peripheral part of the mount surface 34a. The peripheral walls 34b are a frame uprising in a rectangular shape so as to surround the mount surface 34a. It is desirable that the material of the tray 34 should be a material that has a high thermal conductivity like metal. In this embodiment, the material of the tray 34 is SUS. The material of the tray 34 may be ceramics or resin with a high thermal conductivity or a combination thereof.

Figure 6:
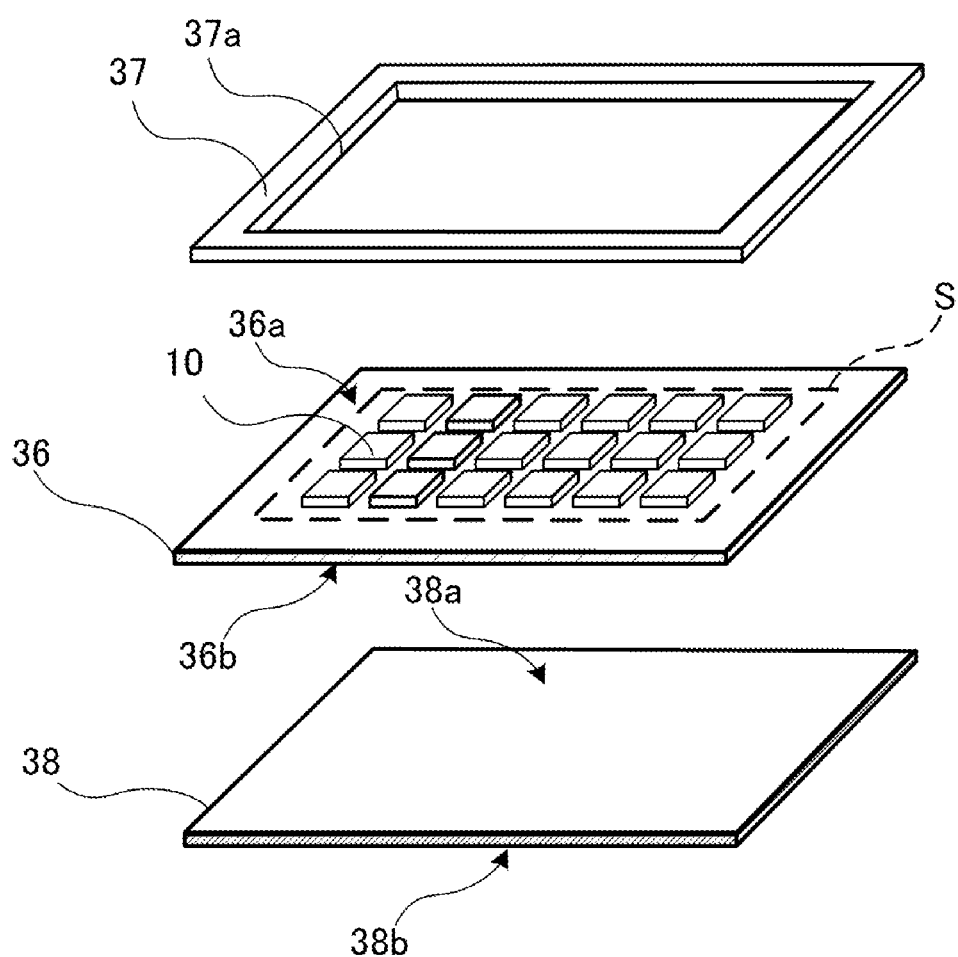
FIG. 6 is an exploded perspective view illustrating a structure of a mount member.
Figure 7:
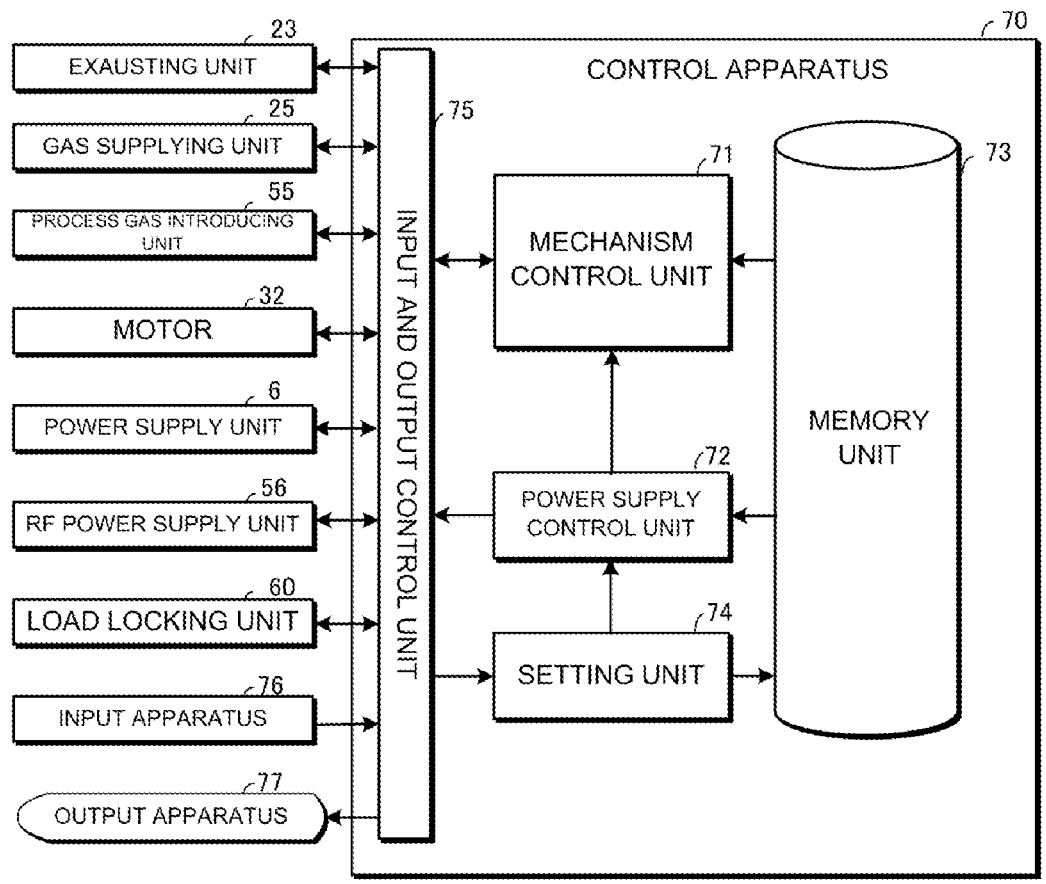
FIG. 7 is a block diagram illustrating a control apparatus according to the embodiment.

The mount member 35 is a member which is mounted on the mount surface 34a of the tray 34, and on which the electronic component 10 is mounted. The mount member 35 includes a holding sheet 36, a frame 37, and a sticking sheet 38. As illustrated in FIG. 6, the holding sheet 36 is a flat sheet, and has an adhesive surface 36a which is one surface of the flat sheet with adhesiveness. The adhesive surface 36a spreads across the entire one surface of the holding sheet 36. The adhesive surface 36a has a pasting region S to which the electronic component 10 is pasted. In this embodiment, the holding sheet 36 is a rectangle, and the pasting region S is a smaller rectangular region than the outer circumference of the holding sheet 36. However, the pasting region S may be the entire surface of the holding sheet 36. The other surface of the holding sheet 36 is a non-adhesive surface 36b having no adhesiveness. The non-adhesive surface 36b may be, for example, a smooth surface.

The frame 37 is a member to which the adhesive surface 36a of the holding sheet 36 is pasted, and defines a part of or the entire outer circumference of the pasting region S. It is desirable that the material of the frame 37 should be a material with a high thermal conductivity, e.g., metal. According to this embodiment, the material of the frame 37 is SUS. Like the tray 34, the material of the frame 37 may be ceramics or resin with an excellent thermal conductivity, or a combination thereof. The material of the tray 34 and that of the frame 37 may be consistent or may be different. The frame 37 of this embodiment surrounds the pasting region S, and defines the entire outer circumference of the pasting region S. The frame 37 is a rectangular plate member, and a rectangular through-hole 37a is formed in the center thereof. The inner circumference of this through-hole 37a matches the outer circumference of the pasting region S. The contour of the frame 37 matches the contour of the holding sheet 36.

The adhesive surface 36a of the holding sheet 36 is pasted to the bottom surface of the frame 37 so as to align the contour of the holding sheet 36 and the contour of the frame 37, and blocks the bottom surface side of the through-hole 37a. Hence, the pasting region S of the adhesive surface 36a is exposed from the through-hole 37a at the top surface side of the frame 37.

As illustrated in FIGS. 5 and 6, the multiple electronic components 10 are stuck and held on the exposed pasting region S within the frame 37. The multiple electronic components 10 are arranged in a matrix with a clearance in such a way that the film can be formed on not only the top surface 12a but also the side surfaces 12b.

As illustrated in FIG. 6, the sticking sheet 38 is a flat sheet, has a first sticking surface 38a on the one surface, and a second sticking surface 38b on the other surface. The first sticking surface 38a is a surface with adhesiveness which sticks to the non-adhesive surface 36b of the holding sheet 36. The first sticking surface 38a sticks across at least the entire region of the non-adhesive surface 36b corresponding to the pasting region S. The region of the non-adhesive surface 36b corresponding to the pasting region S is a region of the non-adhesive surface 36b at the opposite side to the pasting region S. In addition, the first sticking surface 38a also sticks to the region of the non-adhesive surface 36b corresponding to the frame 37. That is, the first sticking surface 38a also sticks to the region of the non-adhesive surface 36b at the opposite side to the frame 37. In this embodiment, the contour dimension of the frame 37, that of the holding sheet 36, and that of the sticking sheet 38 are consistent with each other.

The second sticking surface 38b is a surface with an adhesiveness which sticks to the mount surface 34a of the tray 34. In this embodiment, the frame 37, the holding sheet 36, and the sticking sheet 38 are laminated so as to the respective contours aligned with each other, and the entire second sticking surface 38b sticks to the tray 34.

In this case, when the adhesive force between the first sticking surface 38a and the non-adhesive surface 36b of the holding sheet 36 is Fa, and the adhesive force between the second sticking surface 38b and the mount surface 34a of the tray 34 is Fb, a condition Fa<Fb is obtained. In addition, it is desirable that a condition such as 2≤(Fb−Fa) should be satisfied. Still further, the materials are applied in such a way that the release resistance of the non-adhesive surface 36b of the holding sheet 36 relative to the first sticking surface 38a is smaller than the release resistance of the mount surface 34a of the tray 34 relative to the second sticking surface 38b. It is desirable that, for example, Fa should be 0.02 to 0.03 [N/25 mm width], and Fb should be 4 to 7 [N/25 mm width]. However, the present disclosure is not limited to these values. In addition, it is desirable that the sticking sheet 38 should have a thermal conductivity of equal to or greater than 0.1 W/(m·K). Still further, the higher thermal conductivity is preferable, but when the thermal conductivity is 1 W/(m·K), and excellent cooling effect is achievable.

Example materials of the holding sheet 36 and the sticking sheet 38 are a synthetic resin with a heat resistance. For example, polyethylene terephthalate (PET), polyethylene naphthalate (PEN), polyimide (PI), etc., are applicable, but the present disclosure is not limited to these materials. As for the adhesive surface 36a, the first sticking surface 38a, and the second sticking surface 38b, an adhesive may be applied to the surface of the sheet, or the surface may be made so as to have an adhesiveness. Example materials of the adhesive or the adhesive surface are silicon-based or acrylic-based resins and other various materials with adhesiveness, such as urethane resin and epoxy resin.

As illustrated in FIGS. 5 and 6, the multiple electronic components 10 are pasted in matrix within the pasting region S of the adhesive surface 36a of the mount member 35. By providing the multiple such mount members 35, and mounting those on the mount surface 34a of the tray 34 via the sticking sheet 38, the second sticking surface 38b of the sticking sheet 38 is stuck to the mount surface 34a. However, the single mount member 35 may be mounted on the tray 34.

As described above, the electronic components 10 are positioned on the rotary table 31 by the tray 34 held by the holding unit 33, the mount member 35, and the sticking sheet 38. In addition, according to this embodiment, since the six holding units 33 are provided, the six trays 34 are held on the rotary table 31 at the interval of 60 degrees. However, the number of the holding unit 33 may be one or a multiple number.

[Film Formation Processing Unit]

The film formation processing units 40A and 40B are each a processing unit which forms a film on the electronic components 10 carried by the carrying unit 30. In the following description, when the individual film formation processing units 40A and 40B are not distinguished, those will be described as the film formation processing unit 40. As illustrated in FIG. 4, the film formation processing unit 40 includes the sputter source 4, a dividing unit 44, and a power supply unit 6.

(Sputter Source)

The sputter source 4 is a supply source of the film formation material which deposits the film formation material on the electronic component 10 by sputtering, and forms a film thereon. The sputter source 4 has the target 41, a backing plate 42, and an electrode 43. The target 41 is formed of the film formation material which is to be deposited on the electronic component 10 and to be a film, and is installed at the position facing with the carrying path L with a distance. As illustrated in FIG. 3, as for the target 41 of this embodiment, two targets 41A and 41B are arranged in the direction orthogonal to the carrying direction, i.e., in the radial direction of the rotation of the rotary table 31. In the following description, when the individual targets 41A and 41B are not distinguished, those will be referred to as the target 41. The bottom side of the target 41 faces the electronic component 10 which is moved by the carrying unit 30 with a distance. Note that the dimension of the processing region that is an execution region where the film formation material can be deposited by the two targets 41A and 41B is larger than the dimension of the tray 34 in the radial direction of the rotary table 31.

Examples film formation materials to be applied are Cu, Ni, Fe, and SUS as will be described later. However, various materials are applicable as long as a film can be formed by sputtering. In addition, the target 41 is formed, for example, in a cylindrical shape. However, other shapes, such as elongated cylindrical shape, and rectangular pillar shape, are also applicable.

The backing plate 42 holds the target 41. The electrode 43 is a conductive member to apply power to the target 41 from the exterior of the chamber 20. The sputter source 4 may be provided with a magnet, a cooling mechanism, etc., as necessary.

(Dividing Unit)

The dividing unit 44 divides film formation positions M1 and M2 where the film formation is performed on the electronic component 10 by the sputter source 4, and a processing position M3 where the surface process is performed. In the following description, when the individual film formation positions M1 and M2 are not distinguished, those will be referred to as the film formation position M. As illustrated in FIG. 3, the dividing unit 44 includes square-shaped wall plates 44a and 44b arranged radially extended from the circumference center of the carrying path L, i.e., from the rotation center of the rotary table 31 of the carrying unit 30. The wall plates 44a and 44b are provided on, for example, the ceiling of the vacuum space 21 and in the positions holding the target 41 therebetween. The lower end of the dividing unit 44 faces the rotary table 31 with a space sufficient for the electronic component 10 to pass through. By providing this dividing unit 44, the reactive gas G and the film formation material are prevented from being dispersed in the vacuum space 21.

The film formation position M includes the target 41 of the sputter source 4, and is a space divided by the dividing unit 44. More specifically, as illustrated in FIG. 3, the film formation positions M1 and M2, and the processing position M3 are, as viewed in the planar direction, sector-shaped spaces surrounded by the wall plates 44a and 44b of the dividing unit 44 and the internal circumference 20c of the chamber 20. The respective ranges of the film formation positions M1 and M2 and the processing position M3 in the horizontal direction are regions divided by the pair of wall plates 44a and 44b. The film formation material is deposited as a film on the electronic component 10 which pass through the position facing the target 41 at the film formation position M. Although majority of film formation is performed in this film formation position M, but there is a leakage of the film formation material from the film formation position M at a region out of the film formation position M, and thus a slight film deposition occurs in such a region. That is, the process region where the film formation is performed is slightly wider than the film formation position M.

(Power Supply Unit)

The power supply unit 6 is a structure which applies electric power to the target 41. The plasma sputtering gas G is produced by applying power to the target 41 from this power supply unit 6, and the film formation material is deposited on the electronic component 10. In this embodiment, the power supply unit 6 is, for example, a DC power supply capable of applying a high voltage. In the case of an apparatus which performs high frequency sputtering, an RF power supply is also applicable. The rotary table 31 is in the same potential as that of the grounded chamber 20, and by applying a high voltage to the target 41, a potential difference is produced. This avoids a difficulty of connection with the power supply unit 6 since the movable rotary table 31 is set to be a negative potential.

The multiple film formation processing units 40 form a film formed of layers with multiple film formation materials by selectively depositing the film formation materials. In particular, in this embodiment, the sputter sources 4 corresponding to different kinds of film formation materials are installed, and a film formed of layers with multiple kinds of film formation material is formed by selectively depositing the film formation materials. The description that the sputter sources 4 corresponding to different kinds of film formation materials means a case in which the film formation materials of all film formation processing units 40 differ and a case in which although the multiple film formation processing units 40 have the common film formation material, but the others have a different film formation material. The description selectively depositing the film formation material kind by kind means that, while the film formation processing unit 40 of a kind of film formation material is performing film formation, the film formation processing unit 40 of the other kinds of film formation materials does not perform film formation. In addition, the film formation processing unit 40 that is performing film formation or the film formation position M means the film formation processing unit 40 or the film formation position M in which power is applied to the target 41 of the film formation processing unit 40, and film formation is ready for the electronic component 10.

According to this embodiment, in the carrying direction of the carrying path L, the two film formation processing units 40A and 40B are provided in the position of holding the surface processing unit 50 therebetween. The film formation positions M1 and M2 correspond to the two film formation processing units 40A and 40B. The film formation material of the film formation processing unit 40A is SUS between these film formation processing units 40A and 40B. That is, the sputter source 4 of the film formation processing unit 40A includes the targets 41A and 41B formed of SUS. The film formation material of the other film formation processing unit 40B is Cu. That is, the sputter source 4 of the film formation processing unit 40B includes the targets 41A and 41B formed of Cu. According to this embodiment, while either one film formation processing unit 40 is performing film formation, the other film formation processing unit 40 does not perform film formation.

[Surface Processing Unit]

The surface processing unit 50 performs surface process, i.e., reverse sputtering, on the electronic component 10 carried by the carrying unit 30. This surface processing unit 50 is provided at the processing position M3 divided by the dividing unit 44. The surface processing unit 50 includes a processing unit 5. An example structure of this processing unit 5 will be described with reference to FIGS. 3 and 4.

The processing unit 5 includes a cylindrical electrode 51 provided from the upper part of the chamber 20 toward the interior. The cylindrical electrode 51 is formed in a rectangular cylinder shape, has an opening 51a at one end, and the other end is blocked. The cylindrical electrode 51 is attached to the opening 21a provided in the top surface of the chamber 20 via an insulating member 52 in such a way that the one end with the opening 51a is directed toward the rotary table 31. The side wall of the cylindrical electrode 51 extends in the interior of the chamber 20.

A flange 51b projecting outwardly is provided at an opposite end of the cylindrical electrode 51 to the opening 51a. The insulating member 52 is fastened between the flange 51b and the outer circumference of the opening 21a of the chamber 20, thereby maintaining an airtightness of the interior of the chamber 20. It is appropriate as long as the insulating member 52 has an insulation property, and the insulating member 52 is not limited to any particular material, but for example, materials like polytetrafluoroethylene (PTFE) is applicable.

The opening 51a of the cylindrical electrode 51 is provided at the position that faces the carrying path L of the rotary table 31. The rotary table 31 carries, as a carrier, the tray 34 on which the electronic components 10 are placed, and causes the tray 34 to pass through a position facing the opening 51a. The opening 51a of the cylindrical electrode 51 has a larger area than that of the tray 34 in the radial direction of the rotary table 31.

As illustrated in FIG. 3, the cylindrical electrode 51 is formed, as viewed in the planar direction, in a sector shape that increases the diameter towards the exterior from the center on the rotary table 31 in the radial direction. The sector shape in this case means the shape of a fan face of a folding fan. The opening 51a of the cylindrical electrode 51 is also formed in a sector shape. The speed of the tray 34 on the rotary table 31 which passes through the position facing the opening 51a becomes slower toward the center side of the rotary table 31 in the radial direction, and becomes faster toward the external side. Hence, when the opening 51a is simply formed in a rectangular or square shape, a difference in time at which the electronic component 10 passes through the position facing the opening 51a occurs at the center side in the radial direction and the external side therein. By increasing the diameter of the opening 51a from the center side in the radial direction towards the external side therein, the time at which the electronic component 10 passes through the opening 51a becomes uniform, enabling a uniform plasma processing to be described later. However, the opening 51a may be in a rectangular or square shape as long as a difference in time at which the electronic component 10 passes through does not become a practical problem.

As described above, the cylindrical electrode 51 passes completely through the opening 21a of the chamber 20, and a part of the cylindrical electrode 51 is exposed to the exterior of the chamber 20. As illustrated in FIG. 4, the part of the cylindrical electrode 51 exposed to the exterior of the chamber 20 is covered by a housing 53. The housing 53 maintains the airtightness of the internal space of the chamber 20. The part of the cylindrical electrode 51 located inside the chamber 20, i.e., the surroundings of the side wall are covered by a shield 54.

The shield 54 is a sector rectangular cylinder coaxial with the cylindrical electrode 51, and is larger than the cylindrical electrode 51. The shield 54 is connected to the chamber 20. More specifically, the shield 54 stands upright from the circumference of the opening 21a of the chamber 20, and the end part extending toward the interior of the chamber 20 is located at the same height as that of the opening 51a of the cylindrical electrode 51. Since the shield 54 serves as the cathode like the chamber 20, it is suitable if the shield 54 is formed of a conductive metal with low electrical resistance. The shield 54 may be integrally formed with the chamber 20, or may be attached thereto using a fastening bracket, etc.

The shield 54 is formed in order to stably generate plasma within the cylindrical electrode 51. Each side wall of the shield 54 is provided so as to extend substantially in parallel with each side wall of the cylindrical electrode 51 with a spcace. It is desirable that the space should be as small as possible because when the space is too large, the electrostatic capacitance becomes small and the generated plasma in the cylindrical electrode 51 enters this space. However, it is not desirable when the space is too small because the electrostatic capacitance between the cylindrical electrode 51 and the shield 54 becomes large. The dimension of the space may be set as appropriate in accordance with a necessary electrostatic capacitance for generating plasma. Although only two side walls of the shield 54 and the cylindrical electrode 51 extending in the radial direction are illustrated in FIG. 4, a space with the same dimension as that of the space between the two side walls in the radial direction is provided between the two side walls of the shield 54 and the cylindrical electrode 51 extending in the circumferential direction.

In addition, the cylindrical electrode 51 is connected to a process gas introducing unit 55. The process gas introducing unit 55 includes, in addition to pipework, unillustrated gas supply source of the process gas G2, pump, valve, etc. This process gas introducing unit 55 introduces the process gas G2 in the cylindrical electrode 51. The process gas G2 can be suitably changed as appropriate in accordance with the purpose of the processing as described above.

An RF power supply 56 that applies a high-frequency voltage is connected to the cylindrical electrode 51. A matching box 57 that is a matching circuit is connected to the output side of the RF power supply 56 in series. The RF power supply 56 is also connected to the chamber 20. When the voltage is applied from the RF power supply 56, the cylindrical electrode 51 serves as the anode, and the chamber 20, the shield 54, and the rotary table 31 serve as the cathode. The matching box 57 stabilizes the plasma discharging by matching the impedance at the input side and the impedance at the output side. Note that the chamber 20 and the rotary table 31 are grounded. The shield 54 connected to the chamber 20 is also grounded. Both the RF power supply 56 and the process gas introducing unit 55 are connected to the cylindrical electrode 51 via a through-hole provided in the housing 53.

When the process gas G2 that is an argon gas is introduced in the cylindrical electrode 51 from the process gas introducing unit 55, and the high-frequency voltage is applied to the cylindrical electrode 51 from the RF power supply 56, plasma argon gas is generated, and thus electrons, ions, and radicals, etc., are produced.

(Load Locking Unit)

The load locking unit 60 carries, while maintaining the vacuum condition of the vacuum chamber 21, the tray 34 on which the unprocessed electronic components 10 are mounted via the mount member 35 into the vacuum space 21 from the exterior by an unillustrated carrying means, and carries the tray 34 on which the processed electronic components 10 are placed via the mount member 35 out from the vacuum space 21 to the exterior. Since well-known structure is applicable to this load locking unit 60, the description will be omitted.

[Control Apparatus]

The control apparatus 70 controls each component of the film formation apparatus 100. For example, this control apparatus 70 may be accomplished by a dedicated electronic circuit, or a computer that is operated by predetermined program, and the like. That is, as for controls on the introduction and exhaust of the sputter gas G1 and the process gas G2 in the vacuum space 21, controls on the power supply unit 6 and the RF power supply 56, and a control on the rotation of the rotary table 31, etc., the control details are programmed which are executed by a processing apparatus like a PLC or a CPU, thus compatible with various kinds of film formation specifications.

specific example details to be controlled are the initial exhaust pressure of the film formation apparatus 100, the selection of the sputter source 4, the applied power to the target 41 and the cylindrical electrode 51, the flow volumes, kinds, introducing times and exhausting times of the sputter gas G1 and the process gas G2, the film formation time, and the rotation speed of the motor 32.

The structure of the control apparatus 70 that causes each component to operate as described above will be described with reference to FIG. 7 that is a virtual functional block diagram. That is, the control apparatus 70 includes a mechanism control unit 71, a power supply control unit 72, a memory unit 73, a setting unit 74, and an input and output control unit 75.

The mechanism control unit 71 controls the exhausting unit 23, the gas supplying unit 25, the process gas introducing unit 55, the motor 32 of the carrying unit 30, the drive source of the load locking unit 60, valves, switches, and power supplies, etc. The power supply control unit 72 controls the power supply unit 6 and the RF power supply 56.

The control apparatus 70 selectively controls the film formation processing units 40 in such a way that, while the film formation processing unit 40 for any kind of film formation material forms a film, the film formation processing unit 40 for the other kind of film formation material does not perform film formation. That is, while applying the voltage to the target 41 of the film formation processing unit 40A to form a film, the power supply control unit 72 does not apply the voltage to the target 41 of the film formation processing unit 40B. In addition, while applying the voltage to the target 41 of the film formation processing unit 40B to form a film, the power supply control unit 72 does not apply the voltage to the target 41 of the film formation processing unit 40A.

The memory unit 73 stores necessary information for the control according to this embodiment. The setting unit 74 sets the information input from the exterior in the memory unit 73. The input and output control unit 75 is an interface that controls signal conversion and signal input and output with each component to be controlled.

In addition, the control apparatus 70 is connected to an input apparatus 76 and an output apparatus 77. The input apparatus 76 is input means, such as a switch, a touch panel, a keyboard, and a mouse, that enables an operator to operate the film formation apparatus 100 via the control apparatus 70. For example, a selection of the sputter source 4 for film formation can be input via the input means.

The output apparatus 77 is output means, such as a display, a lamp, and a meter, which enable the operator to visually check information for confirming the status of the apparatus. For example, the output apparatus 77 is capable of display the film formation positions M1 and M2 corresponding to the sputter sources 4 performing film formation, and the processing position M3 where the surface process is performed so as to be distinguished from the position where film formation or process is not performed.

[Operation]

An operation according to the above embodiment will be described below with reference to FIGS. 8 and 9 in addition to FIGS. 1 to 7. Although it is not illustrated in the figures, the tray 34 on which the electronic components 10 are placed via the mount member 35 is carried in, is conveyed, and is carried out from, the film formation apparatus 100 by carrying means, such as a conveyer, and a robot arm.

Figure 8A:
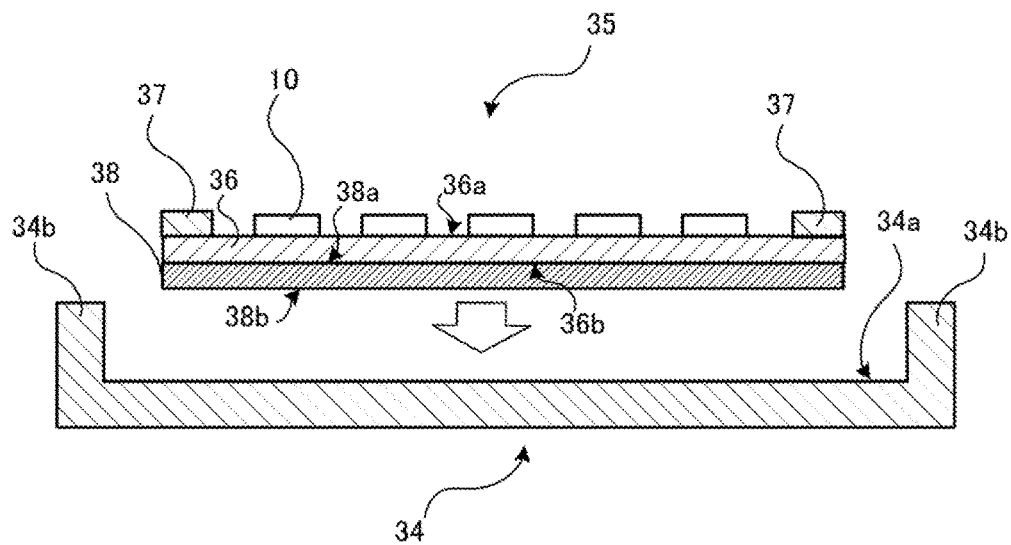
FIGS. 8A to 8C are each an explanatory diagram illustrating a mounting on the tray of the mount member, and a separation of a sticking sheet.
Figure 8B:
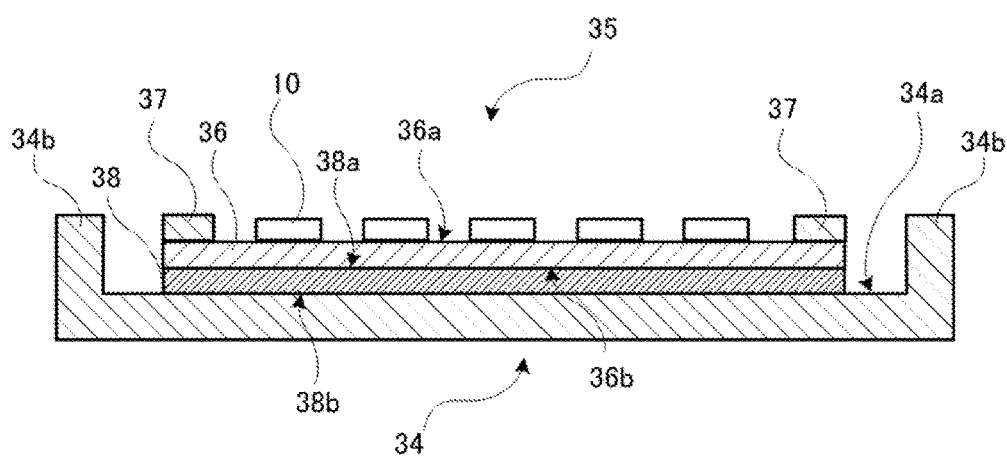

As illustrated in FIGS. 5 and 8A, the electronic components 10 are pasted in matrix on the pasting region S within the frame 37 of the mount member 35 with an interval relative to each other. The multiple mount members 35 are placed on the mount surface 34a of the tray 34. Hence, as illustrated in FIG. 8B, the second sticking surface 38b of the sticking sheet 38 sticks to the mount surface 34a. As will be described later, like the sticking sheet 38 pasted on the mount surface 34a and the sticking sheet 38 formed on the mount surface 34a by coating, adhesive application, or processing, etc., the non-adhesive surface 36b of the holding sheet 36 pasted on the frame 37 may be pasted on the sticking sheet 38 provided on the mount surface 34a. That is, a structure in which the holding sheet 36 and the sticking sheet 38 are integrated during the procedure of mounting the mount member 35 on the tray 34 such that the holding sheet 36 is pasted on the sticking sheet 38 provided on the tray 34 is also involved in the structure in which the mount member 35 includes the holding sheet 36 and the sticking sheet 38. In the case of the sticking sheet 38 formed on the mount surface 34a by pasting, coating, adhesive application, or processing, etc., the interface between the sticking sheet 38 and the tray 34 becomes the second sticking surface 38b.

The multiple trays 34 are carried in the chamber 20 by the carrying means of the load locking unit 60 in sequence. The rotary table 31 moves the empty holding unit 33 to the carry-in location from the load locking unit 60 in sequence. The holding unit 33 individually holds the tray 34 carried in by the carrying means. Hence, as illustrated in FIGS. 2 and 3, the trays 34 on which the electronic component 10 that is a film-formation object is placed are all placed on the rotary table 31.

The film formation process to the electronic components 10 introduced in the film formation apparatus 100 as described above will be described with reference to FIGS. 3 and 4. The following operation is an example in which the electromagnetic-wave shielding film 13 is formed on the surface of the electronic component 10 by the film formation processing units 40A, 40B after cleansing and surface roughening are performed on the surface of the electronic component 10 by the surface processing unit 50. The electromagnetic-wave shielding film 13 is formed by alternately laminating the SUS layer and the Cu layer. The SUS layer directly formed on the electronic component 10 becomes a base layer that increases the degree of adhesion with mold resin and Cu. The middle Cu layer is a layer that has the shielding function of electromagnetic wave. The outermost SUS layer is a protective layer that suppresses a corrosion, etc., of Cu.

First, the exhausting unit 23 exhausting the gas from the vacuum space 21 to depressurize the vacuum space 21, thereby obtaining the vacuum condition therein. The rotary table 31 rotates and reaches the predetermined rotation speed. In the processing unit 5, the electronic component 10 passes through the position facing the opening 51a of the cylindrical electrode 51. In the processing unit 5, the process gas introducing unit 55 introduces the argon gas that is the process gas G2 in the cylindrical electrode 51, and the RF power supply 56 applies the high-frequency voltage to the cylindrical electrode 51. The plasma argon gas is produced by application of the high-frequency voltage, and thus electrons, ions, and radicals, etc., are produced. The plasma flows into the rotary table 31 that is cathode from the opening 51a of the cylindrical electrode 51 that is anode. The surface of the electronic component 10 is cleaned and roughened by colliding the ions in the plasma with the surface of the electronic component 10 which passes through the location under the opening 51a. Next, when the surface process time by the surface processing unit 50 elapses, the surface processing unit 50 is deactivated. That is, the supply of the process gas G2 from the process gas introducing unit 55 and the application of the voltage by the RF power supply 56 are terminated.

Next, the gas supplying unit 25 of the film formation processing unit 40A supplies the sputter gas G1 around the target 41. In this condition, the electronic component 10 held by the holding unit 33 move on the carrying path L along the trajectory that draws a circle, and passes through the position facing the sputter source 4.

Subsequently, the power supply unit 6 applies the power to the target 41 only in the film formation processing unit 40A. Hence, the plasma sputter gas G1 is produced. In the sputter source 4, the ions produced by plasma collide with the target 41, and the particles of the film formation material are beaten out. Hence, every time the electronic component 10 passes through the film formation position M1 of the film formation processing unit 40A, the particles of the film formation material are deposited on the surface of the electronic component 10, and thus a film is formed. In this case, the SUS layer is formed. At this time, although the electronic component 10 passes through the film formation position M2 of the film formation processing unit 40B, no power is applied to the target 41 in the film formation processing unit 40B, and thus no film formation process is performed and the electronic component 10 is not heated. In addition, the electronic component 10 is not heated in regions other than the film formation positions M1 and M2. Thus, in the regions where the electronic component 10 is not heated, the electronic component 10 dissipates heat.

When the film formation time by the film formation processing unit 40A elapses, the film formation processing unit 40A is deactivated. That is, application of the power to the target 41 by the power supply unit 6 is terminated. Next, the power supply unit 6 of the film formation processing unit 40B applies the power to the target 41. Hence, the plasma sputter gas G1 is produced. In the sputter source 4, the ions produced by plasma collide with the target 41, and the particles of the film formation material are beaten out. Hence, every time the electronic component 10 passes through the film formation position M2 of the film formation processing unit 40B, the particles of the film formation material are deposited on the surface of the electronic component 10, and thus a film is formed. In this case, the Cu layer is formed. This layer becomes one of the layers that form the electromagnetic-wave shielding film. At this time, although the electronic component 10 passes through the film formation position M1 of the film formation processing unit 40A, no power is applied to the target 41 in the film formation processing unit 40A, and thus no film formation process is performed and the electronic component 10 is not heated. In addition, the electronic component 10 is not heated in regions other than the film formation positions M1 and M2. Thus, in the regions where the electronic component 10 is not heated, the electronic component 10 dissipates heat.

When the film formation time by the film formation processing unit 40B has elapsed, the film formation processing unit 40B is deactivated. That is, the power application to the target 41 by the power supply unit 6 is terminated. Next, the power supply unit 6 of the film formation processing unit 40A applies the power to the target 41. Hence, the plasma sputter gas G1 is produced. In the sputter source 4, the ions produced by plasma collide with the target 41, and the particles of film formation material are beaten out. Hence, every time the electronic component 10 passes through the film formation position M1 of the film formation processing unit 40A, the particles of the film formation material are deposited on the surface of the electronic component 10, and thus a film is formed. In this case, the SUS layer is formed. At this time, although the electronic component 10 passes through the film formation position M2 of the film formation processing unit 40B, no power is applied to the target 41 in the film formation processing unit 40B, and thus no film formation process is performed and the electronic component 10 is not heated. In addition, the electronic component 10 is not heated in regions other than the film formation positions M1 and M2. Thus, in the regions where the electronic component 10 is not heated, the electronic component 10 dissipates heat.

When the film formation time by the film formation processing unit 40A has elapsed, the film formation processing unit 40A is deactivated. That is, the power application to the target 41 by the power supply unit 6 is terminated. Thus, the film formed of the SUS film, the Cu film, and the SUS film laminated with each other is formed by repeating the film formation by the film formation processing units 40A and 40B. In addition, the film that includes more than three layers can also be formed by repeating the similar film formation. Hence, from the state illustrated in FIG. 9A, as illustrated in FIG. 9B, the electromagnetic-wave shielding film 13 is formed on the top surface of the package 12 of the electronic component 10 and the side surface thereof.

Figure 8C:
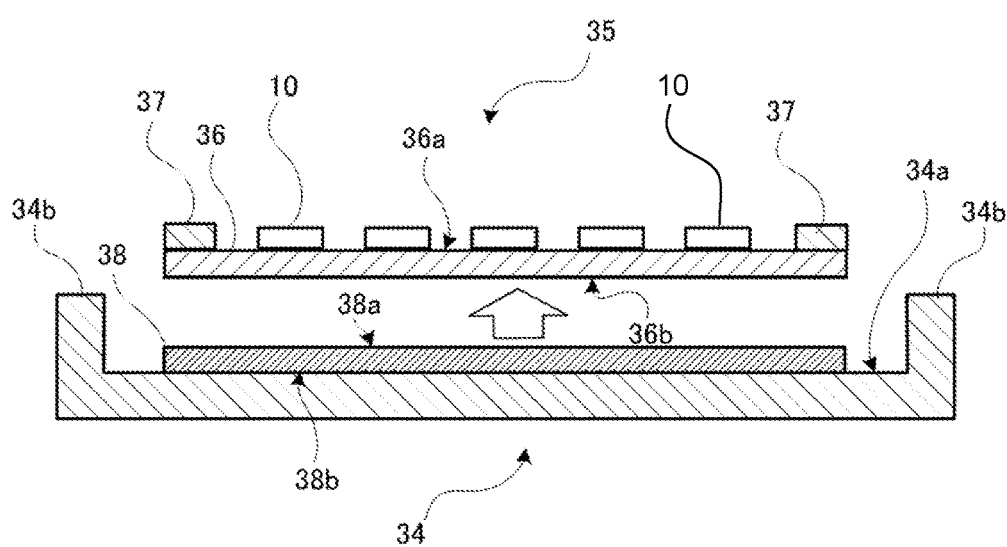

During the film formation process as described above, the rotary table 31 keeps circulating and carrying the tray 34 on which the electronic components 10 are placed by continuous rotation of the rotary table 31. Next, after the film formation process completes, the tray 34 on which the electronic components 10 are placed is positioned in sequence relative to the load locking unit 60 by the rotation of the rotary table 31, and is carried out to the exterior by the carrying means. As illustrated in FIG. 8C, the mount member 35 is separated from the carried tray 34 by separating the holding sheet 36 from the sticking sheet 38. That is, the sticking sheet 38 is separated from the mount member 35. Thus, the sticking sheet 38 left on the tray 34 can be re-used as it is. That is, the film formation process can be performed in the same manner as described above by sticking the non-adhesive surface 36b of the holding sheet 36 on which the electronic components 10 to be processed next are placed to the first sticking surface 38a of the sticking sheet 38 on the tray 34, and carrying the tray 34 in the vacuum space 21. According to such a configuration, the mount member 35 that includes the sticking sheet 38 is constructed by pasting the holding sheet 36 to the sticking sheet 38, and thus the film formation apparatus 100 that includes the mount member 35 is constructed. When the sticking force of the sticking sheet 38 decreases by multiple usages, the sticking sheet 38 may be separated from the tray 34, and the mount member 35 that includes the new sticking sheet 38 may be mount on the tray 34. The number of times that the sticking sheet 38 can use may be set by, for example, tests. When the sticking sheet 38 is changed, only the sticking sheet 38 may be replaced with new one and as for the holding sheet 36 and the frame 37, both may be reused, either one may be reused and the other may be replaced, or both may be replaced with new ones. After the holding sheet 36 is separated, without reusing the sticking sheet 38, the sticking sheet 38 may be separated from the tray 34, and may be disposed. That is, every time, the sticking sheet 38 left on the tray 34 may be separated and disposed, and the mount member 35 that includes the sticking sheet 38 may be mounted on the tray 34.

[Reasons for the Heating of Electronic Component is Progressed]

As described above, the electronic component 10 can dissipate heat in the regions where the electronic component 10 is not heated. This heat dissipation is mainly performed by heat conduction to the tray 34 via the mount member 35. When, however, unlike this embodiment, no sticking sheet 38 is provided, the following problems occur.

(1) When the Bottom Surface of the Holding Sheet 36 of the Mount Member 35 has no Adhesiveness Although the adhesive surface 36a to which the electronic components 10 are pasted is provided on the upper surface of the holding sheet 36 of the mount member 35, the bottom surface of the holding sheet 36 does not have adhesiveness. For this reason, a gap is produced between the bottom surface of the holding sheet 36 and the mount surface 34a of the tray 34 when the mount member 35 is simply mounted on the mount surface 34a. That is, since there are microscopic concavities and convexities in the surface of the holding sheet 36 and the surface of the mount surface 34*a*, the contact area is substantially 10% of the total area. Since the non-contact space is vacuum, there is no heat conduction. Hence, heat transfer from the electronic component 10 to the tray 34 becomes difficult.

(2) When the Bottom Surface of the Holding Sheet 36 of the Mount Member 35 has Adhesiveness In order to address the above problem (1), the bottom surface of the holding sheet 36 may be given with adhesiveness. In this case, since the mount member 35 can closely contact with the mount surface 34*a* of the tray 34, the gap between the bottom surface of the holding sheet 36 and the mount surface 34*a* remarkably decreases, and thus heat conductivity improves. In this case, however, the process of separating the bottom surface of the holding sheet 36 of the mount member 35 from the mount surface 34*a* of the tray 34 is necessary after the film formation process. When the mount member 35 is separated from the mount surface 34*a*, it is difficult to uniformly transfer force to the sticking surface, and thus the separating force may be applied partially, and the frame 37 and the holding sheet 36 may be distorted. When the frame 37 and the holding sheet 36 are distorted, the flatness of the placement surface for the electronic components 10 may be lost, or the placement interval of the electronic component 10 may vary, which is not suitable for the later processes like pickup process.

In addition, when the electronic component 10 is picked up from the holding sheet 36, the electronic component 10 is pushed up one by one by a pin 84 from the bottom surface of the holding sheet 36. Hence, when the bottom surface has adhesiveness, adhesive adheres to the pin 84, and thus the pin contact location and the contact area change. This disables a precise pickup. In addition, when the contacting pin 84 is released from the holding sheet 36, the holding sheet 36 is pulled while sticking to the pin 84. Subsequently, the tension of the holding sheet 36 becomes greater than the sticking force of adhesive of the holding sheet 36, and the pin 84 is separated. When the electronic components 10 are flipped by such a release of the pin 84, an adverse effect occurs such that the electronic components 10 may be misaligned and separated from the holding sheet 36.

[Reason Why the Heat Dissipation of the Electronic Component Improves]

In this embodiment, the opposite surface to the adhesive surface 36*a* of the holding sheet 36 of the mount member 35 is the non-adhesive surface 36*b* having no adhesiveness. However, this holding sheet 36 sticks to the mount surface 34*a* of the tray 34 via the sticking sheet 38. Accordingly, the heat of the electronic component 10 is transferred to the tray 34 via the holding sheet 36 and the sticking sheet 38. Hence, heating of the electronic component 10 is suppressed.

In addition, the adhesive force between the first sticking surface 38*a* and the non-adhesive surface 36*b* is smaller than the adhesive force between the second sticking surface 38*b* and the mount surface 34*a*. Hence, when the holding sheet 36 is separated from the tray 34, with the second sticking surface 38*b* sticking to the mount surface 34*a*, the holding sheet 36 easily separates from the first sticking surface 38*a*. Accordingly, the frame 37 and the holding sheet 36 are not likely to be distorted. Since the opposite surface to the adhesive surface 36*a* of the holding sheet 36 is the non-adhesive surface 36*b*, when the electronic component 10 is picked up, the holding sheet 36 does not stick to the pin 84.

[Action and Effect]

According to this embodiment, the film formation apparatus includes the chamber 20 that is a container in which the sputter gas G1 is introduced, the carrying unit 30 which is provided in the chamber 20, and which circulates and carries the electronic component 10, the film formation processing unit 40 which includes the sputter source 4 that deposits the film formation material by sputtering on the electronic component 10 being circulated and carried by the carrying unit 30 to form a film, and which forms the film on the electronic component 10 using the sputter source 4, the tray 34 which is carried by the carrying unit 30, and which includes the mount surface 34*a*, and the mount member 35 which is mounted on the mount surface 34*a*, and on which the electronic component 10 is placed.

The mount member 35 includes the holding sheet 36 which has the adhesive surface 36*a* that is one surface with adhesiveness, and the non-adhesive surface 36*b* that is the other surface without an adhesiveness, and the sticking sheet 38 which has the first sticking surface 38*a* with adhesiveness that is one surface sticking to the non-adhesive surface 36*b*, and the second sticking surface 38*b* with adhesiveness that is the other surface sticking to the mount surface 34*a* of the tray 34. The adhesive surface 36*a* has the pasting region S for pasting the electronic components 10, and the first sticking surface 38*a* sticks across the entire region of the non-adhesive surface 36*b* corresponding to at least the pasting region S.

Hence, the heat of the electronic component 10 is transferred to the tray 34 via the holding sheet 36 and the sticking sheet 38 and is efficiently dissipated, and thus the heating of the electronic component 10 can be suppressed without increasing the structural complexity of the apparatus and the size thereof. In addition, it is unnecessary to utilize power for cooling, facilitating a maintenance.

The frame 37 that defines a part of or all of the outer circumference of the pasting region S is pasted on the adhesive surface 36*a* of the holding sheet 36, and the first sticking surface 38*a* sticks to, in addition to the entire region of the non-adhesive surface 36*b* corresponding to the pasting region S, the region of the non-adhesive surface 36*b* corresponding to the frame 37.

Hence, the heat from the frame 37 is also transferred to the tray 34 via the holding sheet 36 and the sticking sheet 38 and is efficiently dissipated. Since the frame 37 is harder than the holding sheet 36, when the holding sheet 36 is separated from the sticking sheet 38, the pasting region S surrounded by the frame 37 is stabilized, and thus an adverse effect to the electronic component 10 can be suppressed. However, in the film formation process etc., the frame 37 is also heated like the electronic component 10. In this embodiment, the cooling effect by the sticking sheet 38 can be acquired also for the frame 37.

In addition, when an adhesive force between the first sticking surface 38*a* and the non-adhesive surface 36*b* is Fa, and an adhesive force between the second sticking surface 38*b* and the mount surface 34*a* is Fb, Fa<Fb is satisfied. More preferably, the sticking sheet 38 is formed of a material such that the separation resistance of the first sticking surface 38*a* relative to the non-adhesive surface 36*b* is smaller than the separation resistance of the second sticking sheet 38*b* relative to the mount surface 34*a*.

Hence, when the sticking sheet 38 is separated from the mount member 35, the sticking sheet 38 remains at the tray-34 side, facilitating the separation of the holding sheet 36. Since the holding sheet 36 can be separated from the sticking sheet 38 by light force, a transformation of the holding sheet 36 is preventable.

Still further, the sticking sheet 38 has the thermal conductivity of equal to or greater than 0.1 W/(m·K). Hence, heat dissipation of the electronic component 10 is promoted, thereby preventing heating.

[Test Results]

Using the film formation apparatus according to this embodiment, and a film formation apparatus according to a comparative example, operations of the actual film formation process were carried out through the above procedures, and the test results that measured a temperature will be described below. However, no electronic component was placed on the mount member. As for the temperature, based on an assumption such that the film temperature≈the electronic component temperature, the temperature of the holding sheet was measured by a thermocouple. The film formation condition of each layer of the electromagnetic-wave shielding film is indicated in FIG. 10. Note that Ar bombard is also called ion bombardment, and is cleansing and surface roughening processes by Ar, and corresponds to the above surface process.

Comparative Example

Figure 11:
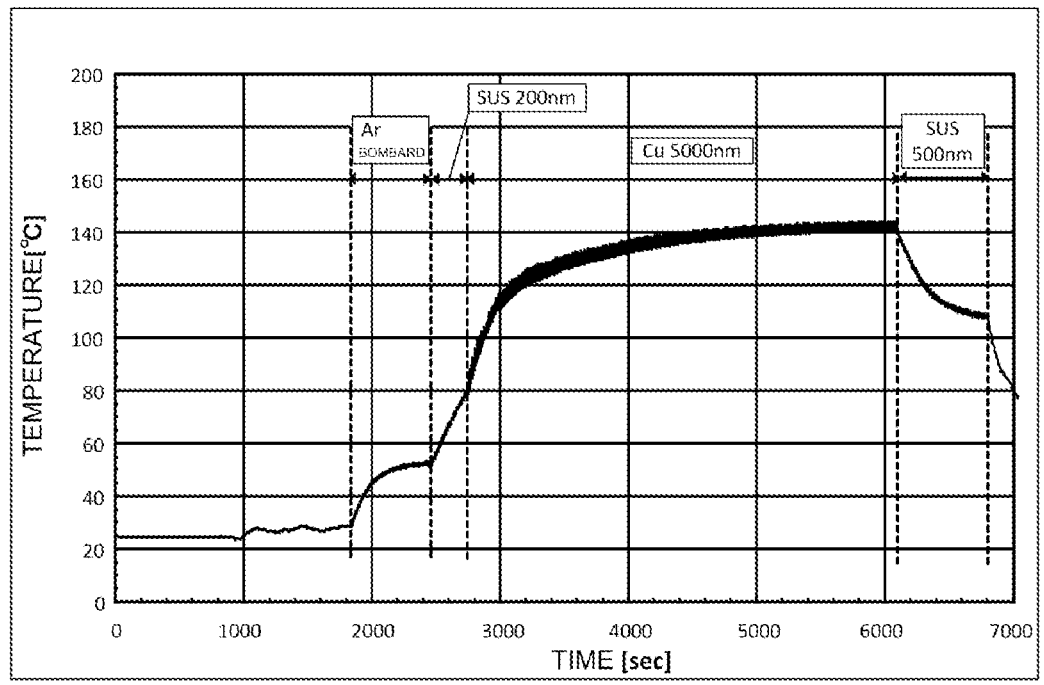
FIG. 11 is a graph illustrating a temperature change over time according to the comparative example.

In the comparative example, film formation was performed without applying a sticking sheet, but applying a PET film as a holding sheet. The test result is illustrated in FIG. 11. According to this test, the temperature is increased up to around 50° C. by the surface process, and up to around 80° C. for the formation of the SUS layer that was the base layer, and further up to around 145° C. for the formation of the Cu layer. The temperature is decreased to around 110° C. for the subsequent formation of the SUS layer that was the protective layer.

According to general semiconductor packages, when the temperature exceeds 150° C., the resin that forms a package is likely to be damaged. For this reason, heating up to around 145° C. that is close to 150° C. is not preferable. In particular, when the temperature exceeds 100° C., moistures and gaseous components of the adhesive are produced from the holding sheet and the sticking sheet, which may deteriorate the film quality such that the electric resistance increases. Hence, in the case of such a film formation apparatus, it is preferable to provide a cooling mechanism.

Example

Figure 12:
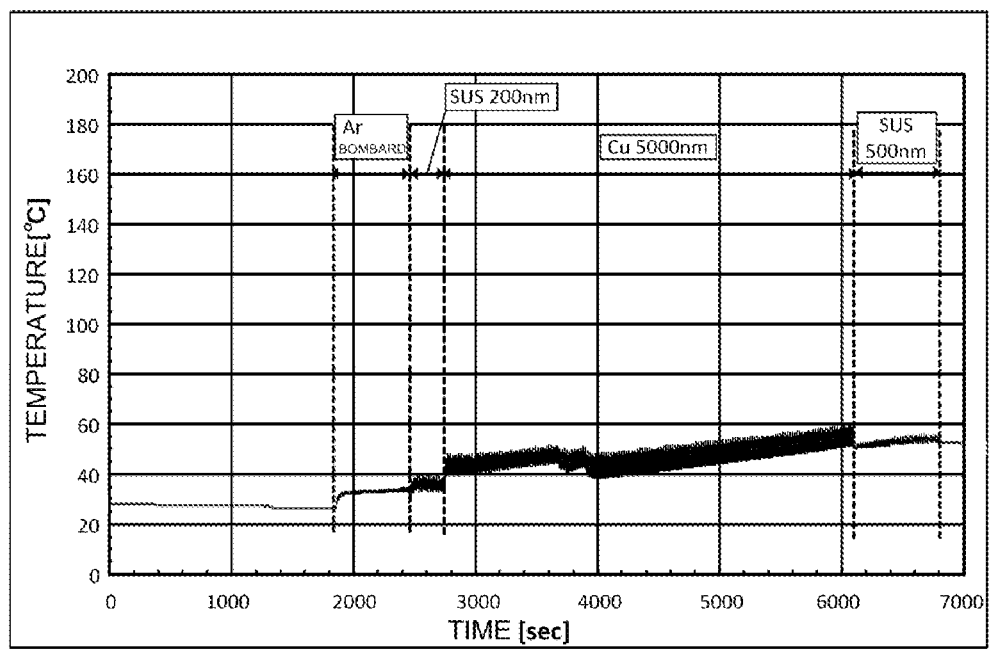
FIG. 12 is a graph illustrating a temperature change over time according to the example.

In the example, film formation was performed by applying a PET film as the holding sheet and by applying a PET film as the sticking sheet. The test result is illustrated in FIG. 12. According to this test, the temperature is increased merely up to around 35° C. in the surface process, and up to around 40° C. for the formation of the SUS layer that was the base layer, and further up to around 60° C. for the formation of the Cu layer. In the subsequent formation of the SUS layer that was the protective layer, the temperature is decreased to around 50° C. Thus, it is apparent that the temperature rise is dramatically suppressed according to the present disclosure. In FIGS. 11 and 12, there are portions such that the measured value fluctuates up and down within a quite-short time interval because of noises, but the entire tendency remains unchanged.

OTHER EMBODIMENTS

The present disclosure is not limited to the above embodiment, and also covers the following aspects.

(1) In the above embodiment, although the holding sheet 36 and the sticking sheet 38 are flat, this means that those are in a plate shape, and the present disclosure is not limited to a case in which the surface thereof is flat. Since the adhesive surface 36a of the holding sheet 36, and the first sticking surface 38a and the second sticking surface 38b of the sticking sheet 38 are surfaces with adhesiveness, there are microscopic concavity and convexity. In addition, the first sticking surface 38a and the second sticking surface 38b of the sticking sheet 38 may be in a shape that includes grooves. For example, grooves in connected with the external space may be formed in either one of or both of the first sticking surface 38a and the second sticking surface 38b. It is preferable that the groove should be as small as possible so as not to disrupt the cooling effect. By providing such grooves, when the holding sheet 36 and the sticking sheet 38 are pasted with each other, even if air bubbles are formed between the sticking surfaces, the air bubbles are likely to be released via the grooves. In addition, the shape divided by the grooves in the sticking sheet 38 may be closed curve shape, such as a polygonal shape like rectangle, a circular shape, or an elliptical shape. In addition, the mount surface 34a of the tray 34 is not limited to the flat surface. In the mount surface 34a and the second sticking surface 38b of the sticking sheet 38, concavities and convexities to be engaged with each other may be formed so as to improve the thermal conductivity by increasing the surface contact area.

(2) Various material capable of forming a film by sputtering are applicable to the film formation material. For example, as for the electromagnetic-wave shielding film, Al, Ag, Ti, Nb, Pd, Pt, Zr, etc., are applicable. In addition, as for the magnetic body, Ni, Fe, Cr, Co, etc., are applicable. Still further, as for the base sticking layer, SUS, Ni, Ti, V, Ta, etc., are applicable, and as for the outermost protective layer, SUS, Au, etc., are applicable.

(3) As for the form of the package 12, various forms available presently or in future, such as BGA, LGA, SOP, QFP, and WLP, are applicable. As for the terminal of the electronic component 10 for external electrical connection, for example, a semi-circular terminal like BGA and a flat terminal like LGA which are provided at a bottom, an elongated thin plate like SOP and QFP which are provided at a side, any terminal available presently or in future are also applicable, and the location where the terminal is formed is not limited to any particular location. In addition, the number of elements 11 sealed in the electronic component 10 may be one or a multiple number.

(4) The number of the targets at the film formation position is not limited to two. The single target or equal to or greater than three targets may be provided. In addition, the number of film formation positions may be equal to or smaller than two or equal to or greater than four.

(5) The number of the trays, that of electronic components which are simultaneously carried, and the number of holding units holding those may be at least one, and are not limited to the numbers exemplified in the above embodiment. That is, a configuration in which the single electronic component is circulated to repeatedly perform film formation, or a configuration in which equal to or greater than two electronic components are circulated to repeatedly perform film formation can be applied.

(6) The cleansing and surface process by etching and asking may be carried out in a different chamber from the chamber that has the film formation position. When an oxidization process or a post-oxidization process is performed, the process gas G2 that is oxygen is applicable. When a nitriding process is performed, the process gas G2 that is nitride is applicable.

(7) In the above embodiment, the description has been given of an example case in which the rotary table 31 rotates within the horizontal plane. However, the direction of the rotation surface of the carrying unit is not limited to any specific direction. For example, the rotation surface that rotates within a vertical plane is applicable. In addition, the carrying means of the carrying unit is not limited to the rotary table. For example, a cylindrical member that has the holding unit holding a workpiece may be a rotation body that rotates around an axis. In addition, the trajectory of the circulation and carrying is not limited to the circular trajectory. The present disclosure broadly covers an aspect in which the electronic component is circulated and carried along an endless carrying path. For example, the trajectory may be a rectangular or elliptical shape, and the carrying path may include a crank or zig-zag path. The carrying path may be formed by, for example, a conveyer.

Still further, according to the present disclosure, the film formation apparatus 100 includes the chamber 20 that is a container in which the sputter gas G1 is introduced, the film formation processing unit 40 that includes the sputter source 4 which is provided in the chamber 20, and which deposits the film formation material by the sputter source 4, and forms a film on an electronic component 10 using the sputter source 4, the tray 34 which is installed at a processing region of the film formation processing unit 40, and which includes a mount surface 34*a*, and the mount member 35 which is mounted on the mount surface 34*a*, and on which the electronic component 10 is placed, the mount member 35 employs the structure as described above. Hence, the film formation apparatus may form a film with the electronic component 10 being remained still without being circulated and carried. The tray 34 on which the electronic components 10 are placed via the mount member 35 may be carried and positioned in the processing region, and the sputtering may be performed without changing the relative position to the target 41.

(8) In the above embodiment, the film formation material of the single kind is selectively deposited kind by kind to form a film. However, the present disclosure is not limited to this case, and it is appropriate as long as a film that includes layers of multiple kinds of film formation materials by selectively depositing the film formation materials. Hence, equal to or greater than two kinds of film formation materials may be deposited simultaneously. For example, the electromagnetic-wave shielding film is formed of an ally containing Co, Zr, and Nb in some cases. In such a case, among the multiple film formation processing units, the film formation processing unit with the film formation material of Co, the film formation processing unit with the film formation material of Zr, and the film formation processing unit with the film formation material of Nb may be simultaneously selected to perform film formation.

In such a case, the film formation processing unit applied for film formation is selected or the installation of the dividing unit that separates the film formation processing unit is set in such a way that, in the circular trajectory, the trajectory passing through the part other than the film formation position where the film formation is being performed becomes longer than the trajectory passing through the film formation position during the film formation.

That is, when film formation is performed by selecting the multiple film formation processing units with a kind of film formation material or the multiple film formation processing units with the multiple kinds of film formation materials, or by selecting the single film formation processing unit, the film formation processing unit applied for film formation is selected or the installation of the dividing unit that separates the film formation processing unit is set in such a way that, in the circular trajectory, the trajectory passing through the part other than the film formation position where the film formation is being performed becomes longer than the trajectory passing through the film formation position during the film formation.

(9) Although the embodiment of the present disclosure and the modified forms thereof are described above, those embodiments and modified forms are merely presented as examples, and are not intended to limit the scope of the present disclosure. These novel embodiments as described above can be carried out in other various forms, and various omissions, replacements, and modifications can be made without departing from the scope of the present disclosure. Such embodiments and modified forms thereof are within the scope of the present disclosure, and also within the scope of the invention as recited in appended claims and equivalent range thereto.

What is claimed is:

1. A film formation apparatus comprising:
   a chamber that is a container in which a sputter gas is introduced;
   a film formation processing unit that comprises a sputter source which is provided in the chamber, and which deposits a film formation material by sputtering, and forms a film on an electronic component using the sputter source;
   a tray which is installed at a processing region of the film formation processing unit, and which comprises a mount surface; and
   a mount member which is mounted on the mount surface, and on which the electronic component is placed,
   wherein:
   the mount member comprises:
      a sticking sheet which is disposed on the mount surface; and
      a holding sheet which is disposed on the sticking sheet,
   the holding sheet has one adhesive surface with an adhesive, and an opposing non-adhesive surface without the adhesive; and
   the sticking sheet has a first sticking surface with an adhesive that is one surface sticking to the non-adhesive surface, and a second sticking surface with an adhesive that is the other surface sticking to the mount surface of the tray,
   the adhesive surface comprises a pasting region for pasting the electronic components,
   the first sticking surface sticks across an entire region of the non-adhesive surface corresponding to at least the pasting region,
   the first sticking surface and the non-adhesive surface are stuck together,
   the second sticking surface and the mount surface are stuck together, and
   when an adhesive force between the first sticking surface and the non-adhesive surface is Fa, and an adhesive force between the second sticking surface and the mount surface is Fb, Fa<Fb is satisfied.

2. A film formation apparatus comprising:
   a chamber that is a container in which a sputter gas is introduced,
   a carrying unit which is provided in the chamber, and which circulates and carries an electronic component;

a film formation processing unit which includes a sputter source that deposits a film formation material by sputtering on the electronic component being circulated and earned by the carrying unit to form a film, and which forms the film on the electronic component using the sputter source;

a tray which is carried by the carrying unit, and which comprises a mount surface; and a mount member which is mounted on the mount surface, and on which the electronic component is placed, wherein:

the mount member comprises:

a sticking sheet which is disposed on the mount surface; and a holding sheet which is disposed on the sticking sheet, the holding sheet has one adhesive surface with an adhesive, and an opposing non-adhesive surface without the adhesive; and the sticking sheet has a first sticking surface with an adhesive that is one surface sticking to the non-adhesive surface, and a second sticking surface with an adhesive that is the other surface sticking to the mount surface of the tray, the adhesive surface comprises a pasting region for pasting the electronic components, the first sticking surface sticks across an entire region of the non-adhesive surface corresponding to at least the pasting region, the first sticking surface and the non-adhesive surface are stuck together, the second sticking surface and the mount surface are stuck together, and when an adhesive force between the first sticking surface and the non-adhesive surface is Fa, and an adhesive force between the second sticking surface and the mount surface is Fb, Fa<Fb is satisfied.

3. The film formation apparatus according to claim 1, wherein:

a frame that defines a part of or all of an outer circumference of the pasting region is pasted on the adhesive surface of the holding sheet; and the first sticking surface sticks to, in addition to the entire region of the non-adhesive surface corresponding to the pasting region, a region of the non-adhesive surface corresponding to the frame.

4. The film formation apparatus according to claim 1, wherein the sticking sheet is formed of a material such that a separation resistance of the first sticking surface relative to the non-adhesive surface is smaller than a separation resistance of the second sticking surface relative to the mount surface.

5. The film formation apparatus according to claim 1, wherein the sticking sheet has a thermal conductivity of equal to or greater than 0.1 W/(m·K).

6. The film formation apparatus according to claim 2, wherein:

a frame that defines a part of or all of an outer circumference of the pasting region is pasted on the adhesive surface of the holding sheet; and the first sticking surface sticks to, in addition to the entire region of the non-adhesive surface corresponding to the pasting region, a region of the non-adhesive surface corresponding to the frame.

7. The film formation apparatus according to claim 2, wherein the sticking sheet is formed of a material such that a separation resistance of the first sticking surface relative to the non-adhesive surface is smaller than a separation resistance of the second sticking surface relative to the mount surface.

8. The film formation apparatus according to claim 2, wherein the sticking sheet has a thermal conductivity of equal to or greater than 0.1 W/(m·K).

* * * * *